United States Patent
Chiu

(10) Patent No.: US 12,379,399 B2
(45) Date of Patent: Aug. 5, 2025

(54) PROBE CARD DEVICE

(71) Applicant: PRINCO CORP., Hsinchu (TW)

(72) Inventor: Pei-liang Chiu, Hsinchu (TW)

(73) Assignee: PRINCO CORP., Hsinchu (TW)

( * ) Notice: Subject to any disclaimer, the term of this patent is extended or adjusted under 35 U.S.C. 154(b) by 436 days.

(21) Appl. No.: 16/726,852

(22) Filed: Dec. 25, 2019

(65) Prior Publication Data

US 2021/0132116 A1 May 6, 2021

(30) Foreign Application Priority Data

Oct. 30, 2019 (TW) ................................ 108139290

(51) Int. Cl.
| | |
|---|---|
| G01R 1/073 | (2006.01) |
| G01R 3/00 | (2006.01) |
| G01R 31/26 | (2020.01) |
| G01R 31/28 | (2006.01) |

(52) U.S. Cl.
CPC ....... *G01R 1/0735* (2013.01); *G01R 1/07328* (2013.01); *G01R 3/00* (2013.01); *G01R 31/2601* (2013.01); *G01R 31/2889* (2013.01)

(58) Field of Classification Search
CPC .............. G01R 1/0735; G01R 1/07328; G01R 31/2601; G01R 31/2889; G01R 3/00
See application file for complete search history.

(56) References Cited

U.S. PATENT DOCUMENTS

| | | | | |
|---|---|---|---|---|
| 5,111,003 | A | * | 5/1992 | Kimbara ............. H01F 17/0013 |
| | | | | 174/255 |
| 5,847,571 | A | * | 12/1998 | Liu ....................... G01R 1/0735 |
| | | | | 324/755.09 |
| 5,977,783 | A | | 11/1999 | Takayama et al. |
| 6,215,321 | B1 | | 4/2001 | Nakata |
| 6,861,858 | B2 | | 3/2005 | Chen et al. |
| 7,414,419 | B2 | | 8/2008 | Dong |
| 7,675,302 | B2 | | 3/2010 | Tunaboylu et al. |
| 9,823,272 | B2 | | 11/2017 | Chen et al. |
| 9,903,887 | B2 | | 2/2018 | Nasu et al. |
| 10,451,654 | B2 | | 10/2019 | Yang et al. |
| 11,067,600 | B2 | | 7/2021 | Takemura et al. |
| 2003/0010976 | A1 | * | 1/2003 | Grube ................. G01R 1/07357 |
| | | | | 257/48 |
| 2005/0095734 | A1 | | 5/2005 | Hasebe |
| 2006/0181292 | A1 | * | 8/2006 | Tunaboylu ......... G01R 1/07357 |
| | | | | 324/756.03 |
| 2011/0024167 | A1 | | 2/2011 | Hashimoto |
| 2011/0175634 | A1 | | 7/2011 | Okamoto |

(Continued)

FOREIGN PATENT DOCUMENTS

| | | | |
|---|---|---|---|
| CN | 1612321 A | | 5/2005 |
| CN | 1632596 A | | 6/2005 |

(Continued)

*Primary Examiner* — Paresh Patel
(74) *Attorney, Agent, or Firm* — Rivka Friedman

(57) ABSTRACT

A probe card device is provided, including a thin film substrate, a first circuit board, and a plurality of probes. The thin film substrate has opposite first and second surface. The first circuit board is disposed over the second surface of the thin film substrate to electrically connect the thin film substrate. The probes are disposed over the first surface of the thin film substrate and are not deformable.

13 Claims, 3 Drawing Sheets

(56) References Cited

U.S. PATENT DOCUMENTS

| | | | |
|---|---|---|---|
| 2012/0306523 A1 | 12/2012 | Kwon | |
| 2014/0210565 A1 | 7/2014 | Vilas Boas | |
| 2014/0354313 A1 | 12/2014 | Kuehnelt | |
| 2015/0123690 A1 | 5/2015 | Kung et al. | |
| 2016/0323996 A1* | 11/2016 | Takemura | H05K 3/4632 |
| 2017/0122981 A1* | 5/2017 | Nasu | H05K 1/0268 |
| 2017/0146570 A1* | 5/2017 | Takemura | H05K 1/0306 |
| 2018/0364280 A1 | 12/2018 | Takemura et al. | |
| 2019/0162778 A1* | 5/2019 | Kanematsu | G01R 31/2884 |
| 2019/0277910 A1 | 9/2019 | Thompson et al. | |

FOREIGN PATENT DOCUMENTS

| | | |
|---|---|---|
| CN | 2804876 Y | 8/2006 |
| CN | 107449948 A | 12/2017 |
| CN | 108713354 A | 10/2018 |
| EP | 3165932 A1 | 5/2017 |
| JP | H07321169 A | 12/1995 |
| JP | 2003057310 A | 2/2003 |
| JP | 2014049589 A | 3/2014 |
| JP | 2017508306 A | 3/2017 |
| JP | 2018200243 A | 12/2018 |
| KR | 20070103073 A | 10/2007 |
| KR | 20170052471 A | 5/2017 |
| TW | M281176 U | 11/2005 |
| TW | 201430352 A | 8/2014 |
| TW | 201839409 A | 11/2018 |
| WO | 03062841 A1 | 7/2003 |
| WO | 2017150232 A1 | 8/2018 |

* cited by examiner

PROBE CARD DEVICE

FIELD OF INVENTION

The present disclosure relates to a test field, and more particularly to a probe card device.

BACKGROUND

When testing a semiconductor wafer, there are usually high and low drops between various detection contacts over the wafer to be tested. Accordingly, it is necessary to pay attention to compliance and maximum allowable displacement of the probe when designing the conventional probe. Therefore, in addition to the contact capability of the conventional probe, it is also necessary to consider whether it has the flexibility to adapt to the high and low drops between different detection contacts over the wafer to be tested, that is its own deformation ability.

The conventional probe card device is manufactured by mechanically or microelectromechanically making a probe have deformability, and then the probe is inserted or welded to the housing one by one. Therefore, the probe card device cannot be integrally fabricated, resulting in high production costs.

However, with the trend of miniaturization of semiconductor processes today, there are more and more detection contacts over the wafer to be tested, and the spacing between the detection contacts is getting less and less. Since the conventional probe cannot be integrally formed, the spacing between the probes cannot be further reduced, and the narrowing of the spacing between the detection contacts on the wafer to be tested cannot be satisfied.

Therefore, the conventional probe card device has encountered problems such as high production cost and limited application.

SUMMARY

In view of this, the present invention provides a probe card device to solve the problems encountered by the conventional probe card device described above.

According to an embodiment, a probe card device is provided, comprising a thin film substrate, a first circuit board, and a plurality of probes. The thin film substrate has opposite first and second surfaces. The first circuit board is disposed over the second surface of the thin film substrate to electrically connect the thin film substrate. The probes are disposed over the first surface of the thin film substrate and are not deformable.

In one embodiment, there is no gap between the first circuit board and the second surface of the thin film substrate.

In one embodiment, the probe card device of the invention further comprises a filling material layer disposed between the second surface of the thin film substrate and the first circuit board.

In one embodiment, the probe card device of the invention further comprises a rigid material layer disposed between the thin film substrate and the first circuit board, wherein the rigid material layer and the thin film substrate are electrically insulated from the first circuit board.

In one embodiment, the probe card device of the invention further comprises a second circuit board electrically connected to a surface of the first circuit board not electrically connecting the thin film substrate.

In one embodiment, the thin film substrate comprises a polyimide material.

In one embodiment, the probe card device of the invention the first circuit board comprises ceramic, tantalum or glass.

In one embodiment, the probe card device of the invention further comprises a second circuit board electrically connecting a surface of the first circuit board not electrically connecting the thin film substrate.

In one embodiment, the probe card device of the invention further comprises a third circuit board electrically connecting a surface of the second circuit board not electrically connecting the first circuit board.

In one embodiment, the probe card device of the invention further comprises a filling material layer disposed between the first circuit board and the second circuit board.

In one embodiment, the probe card device of the invention further comprises a filling material disposed between the second circuit board and the third circuit board.

The probe card device of the invention provides a plurality of embodiments of probes being integrally formed. The formed probes have functions of the conventional probe housing, and the plurality of organic dielectric material layers in the probe card device located below the probes provides the compliance or buffering capability required for each probe to adapt to high and low drops of the contact of the wafer to be tested, thereby reducing the manufacturing cost and the pitch between the probes, thereby providing a probe card device having a suitable number of probes and a suitable pitch between the probe in response to the trend of miniaturization of the semiconductor process to fabricate the wafer to be tested.

BRIEF DESCRIPTION OF DRAWINGS

To detailly explain the technical schemes of the embodiments or existing techniques, drawings that are used to illustrate the embodiments or existing techniques are provided. Apparently, the illustrated embodiments are just a part of those of the present disclosure. It is easy for any person having ordinary skill in the art to obtain other drawings without labor for inventiveness.

DETAILED DESCRIPTION

Probe card devices according to various embodiments of the present invention will be described below in conjunction with FIG. 1-6.

Figure 1:
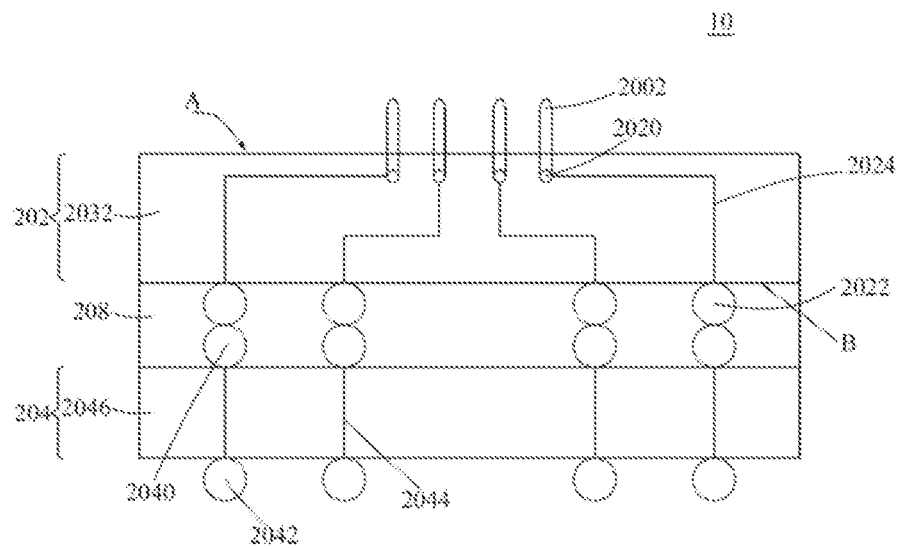
FIG. 1 is a schematic cross-sectional view showing a probe card device according to a first embodiment of the present invention.

Referring to FIG. 1, a cross-sectional view of a probe card device 10 in accordance with a first embodiment of the present invention is shown. The probe card device 10 comprises a thin film substrate 202, a first circuit board 204, an underfill layer 208, and a plurality of probes 2002. The thin film substrate 202 has an opposite first surface A and a second surface B. The first circuit board 204 is disposed over the second surface B of the thin film substrate 202 and electrically connected to the thin film substrate 202. The probes 2002 are disposed over a first surface A of the thin film substrate 202 with a predetermined pitch therebetween and partially embedded in the thin film substrate 202. The probes 2002 are not deformable.

As shown in FIG. 1, the thin film substrate 202 comprises a thin film body 2032, a plurality of first thin film connecting points 2020 are embedded in the thin film body 2032 and adjacent to the first surface A of the thin film substrate, a plurality of second thin film connecting points 2022 formed over a second surface B of the thin film body 2032, and at least one inner metal layer 2024 disposed inside the thin film body 2032. At least one of the first thin film connecting points 2020 is electrically connected to at least one of the second thin film connecting points 2022 through the at least one inner metal layer 2024. A pitch between the two adjacent first thin film connecting points 2020 is less than a pitch between two adjacent second thin film connecting points 2022. The thin film substrate 202 is used to electrically connect the probes 2020 with a narrow pitch to the first circuit board 204 with a wider pitch. The surfaces of the second thin film connecting points 2022 comprise an electroless nickel electroless palladium and immersion Gold (ENEPIG), an electroless nickel immersion gold (ENIG), or an organic solderability preservative (OSP).

In one embodiment, each of the second thin film connecting points 2022 may be a solder ball. In another embodiment, each of the second thin film connecting points 2022 may have a complex welding structure. Specifically, each of the second thin film connecting points 2022 comprises a metal material and a tin material coating the metal material.

One terminal of each of the probes 2002 is electrically connected to one of the first thin film connecting points 2020, and the other terminal of each of the probes 2002 is electrically connected to a chip contact (not shown), which is a contact of a chip (not shown) to be tested.

In addition, the first circuit board 204 comprises a circuit board body 2046, a plurality of first circuit board connecting points 2040 formed over a first surface of the circuit board body 2046, and a plurality of second circuit board connecting points 2042 formed over a second surface of the circuit board body 2046. At least one of the second thin film connecting points 2022 is electrically connected to at least one of the first circuit board connecting points 2040. At least one of the first circuit board connecting points 2040 is electrically connected to at least one of the second circuit board connecting points 2042 via at least one inner metal layer 2044.

Furthermore, in the probe card device 10 shown in FIG. 1, the underfill layer 208 is formed between the thin film substrate 202 and the first circuit board 204 to cover the second thin film connecting points 2022 and the first circuit board connecting points 2040. The thin film substrate 202 provides a wiring function, and the first circuit board 204 and the underfill layer 208 provide a supporting function. Since the wiring function and the supporting function are respectively provided by different components, the wiring function and the supporting function can be simultaneously enhanced.

Figure 2:
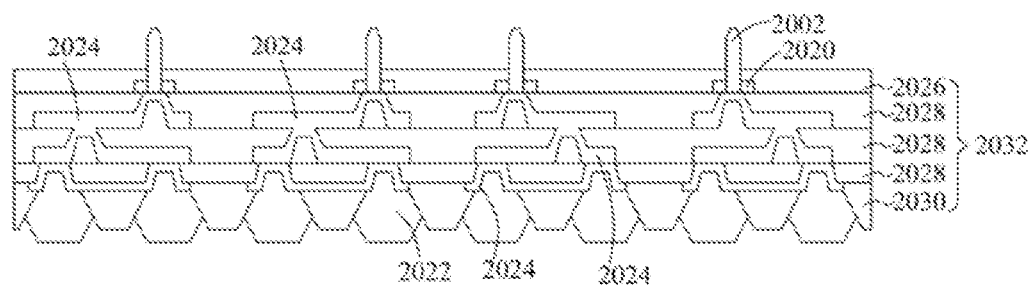
FIG. 2 is a schematic cross-sectional view showing an arrangement of the thin film substrate and the probes in the probe card device of FIG. 1.

Referring to FIG. 2, an arrangement of the thin film substrate and the probes in the probe card device of FIG. 1 is shown. The thin film substrate 202 comprises the thin film body 2032, the first thin film connecting points 2020, the probes 2002, at least one inner metal layer 2024, and the second thin film connecting points 2022. The thin film body 2032 comprises a first surface dielectric layer 2026, at least one internal dielectric layer 2028, and a second surface dielectric layer 2030. In this embodiment, the thin film substrate 202 comprises three internal metal layers 2024 and three internal dielectric layers 2028, but the present invention is not limited thereto.

The first film connecting points 2020 are embedded in the first surface dielectric layer 2026. The probes 2002 are also partially embedded in the first surface dielectric layer 2026 and surrounded by one of the first thin film connecting points 2020. The inner metal layers 2024 are formed in the corresponding inner dielectric layers 2028, and the second thin film connecting points 2022 are formed in the second surface dielectric layer 2030. The first thin film connecting point 2020 and at least one of the probes 2002 are electrically connected to at least one of the second film connecting points 2022 through at least one inner metal layer 2024.

The thin film substrate 202 may comprise 4 layers to 20 layers. A thickness of each of the first surface dielectric layer 2026, the at least one inner dielectric layer 2028, and the second surface dielectric layer 2030 ranges from 5 micrometers (μm) to 20 μm. The first surface dielectric layer 2026, the at least one inner dielectric layer 2028, and the second surface dielectric layer 2030 may comprise organic dielectric materials such as polyimide. A height of each of the first thin film connecting points 2020, a thickness of the at least one inner metal layer 2024, and a height of each of the second thin film connecting points 2022 ranges from 1 μm to 10 μm. A line width of the at least one inner metal layer 2024 ranges from 2 μm to 100 μm. It is noted that the at least one inner metal layer 2024 may be a whole surface metal layer to be served as a power layer or a ground layer. A via size of the at least one inner metal layer 2024 is ranged from 10 μm to 50 μm.

The circuit board body 2046 of FIG. 1 may comprise materials such as silicon, an organic material or a ceramic material. The circuit board 204 has a larger Young's modulus when the circuit board body 2046 comprises the ceramic material, so that the ceramic material is not easily bent and can provide better support functions when the probe 2002 applies an external force to contact the wafer contacts. A metal layer (not shown) of the first circuit board 204 may have a line width greater than 20 microns, and a via (not shown) of the metal layer of the first circuit board 204 may have a via size greater than 20 microns.

In the probe card device 10 shown in FIG. 1, the probes 2002 and the first thin film connecting points 2020 can be formed by semiconductor processing. For example, after forming the first surface dielectric layer 2026, and after positions of the probes 2002 and the first film connecting points 2020 are determined, a suitable opening is opened in the first surface dielectric layer 2026 by methods such as a laser opening or an organic dielectric layer etching to arrive a metal layer in which the first thin film connecting point 2020 is located. A plurality of probes 2002 and a plurality of first thin film connecting points 2020 are simultaneously formed in and over the first surface dielectric layer of the thin film substrate 202 by electroplating or a lithography process cooperating with a physical vapor deposition. The pitch between the probes 2002 can be appropriately adjusted by the control of the lithography process to reduce the pitch between the probes 2002 to within 30 micrometers, so that tens of thousands of probes 2002 can be simultaneously formed over the probe card device 10, thereby reducing the manufacturing cost of the probe card device 10.

As shown in FIG. 2, the probe card device 10 of the present invention can meet the testing requirements of today's and future semiconductor wafers, and since the probes 2002 are not deformable, so there is no need to consider their deformability, and the diameter thereof can be appropriately increased to reduce an impedance of the probes 2002 to meet future testing requirements such as high frequency, 5G communication chips in the further. In addition, since the probes 2002 are embedded in the thin film body 2032 composed of an organic dielectric material, a moderate buffering capacity and compliance between the various probes 2002 can be provided by the elastic properties of the organic dielectric layer materials, such as polyimide, under the probes, and the buffering capacity and compliance can be improved by appropriately increasing a thickness of the organic dielectric under the probe in response to the test problems caused by the height differences between the wafer contacts to be tested.

In short, due to the arrangement of the first circuit board 204, the flatness and support to the probe card device 10 can be provided, and the compliance or buffering capability required for each probe 2002 to adapt to height differences of contacts of the wafer to be tested can be provided by the elasticity of the organic dielectric material located under the probes 2002 of the thin film substrate 202, so that the probes 2002 have the function of self-deforming ability of the conventional needles fixed to the needle housing. Thus, from a general point of view, the tens of thousands of probes 2002 disposed over the thin film substrate 202 can have a flatness equivalent to that of the circuit board, and the individual probes 2002 also have the compliance or buffering capability of the contact height differences of a wafer to be tested from a microscopic view.

Figure 3:
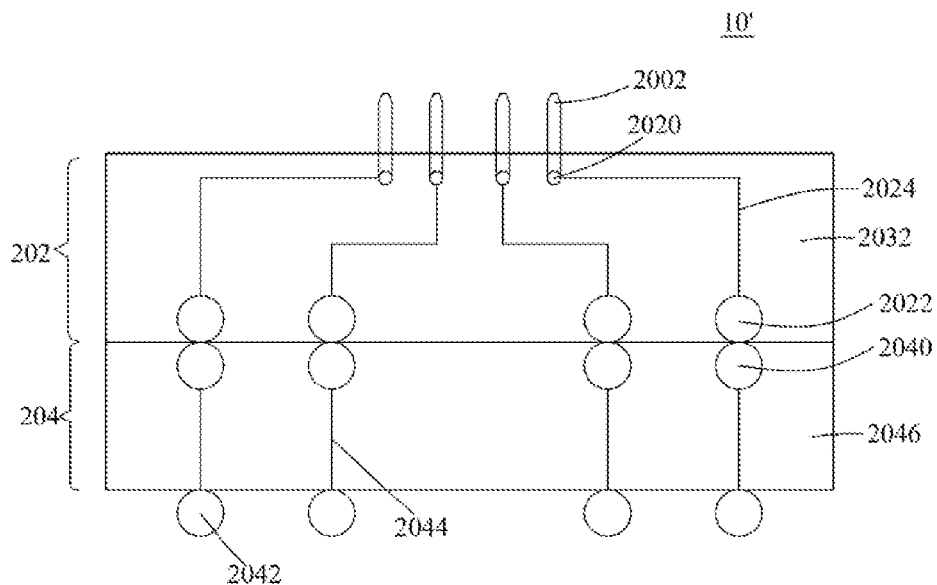
FIG. 3 is a schematic cross-sectional view showing the probe card device according to the second embodiment of the present invention.

FIG. 3 is a schematic cross-sectional view showing a probe card device 10' according to a second embodiment of the present invention. In this embodiment, the probe card device 10' is similar to the probe card device 10 shown in FIG. 1, except that an arrangement of the underfill layer 208 in FIG. 1 is omitted and locations of the second thin film connecting points 2022 of the thin film substrate 202 are adjusted, other components of the probe card device 10' is disposed in the same manner as those of the probe card device 10.

As shown in FIG. 3, the second thin film connecting points 2022 of the thin film substrate 202 are disposed in the thin film body 2032 and adjacent to the second surface B of the thin film substrate 202, and the first circuit board connecting points 2040 of the first circuit board 204 are disposed in the circuit board body 2046 and adjacent to the second thin film connecting points 2022 of the thin film substrate 202. Therefore, there is no gap formed between the first circuit board 204 and the second surface B of the thin film substrate 202, and the first circuit board connecting points 2040 physically contact the second thin film connecting point 2022 to form electrical connections between the thin film substrate 202 and the first circuit board 204.

Figure 4:
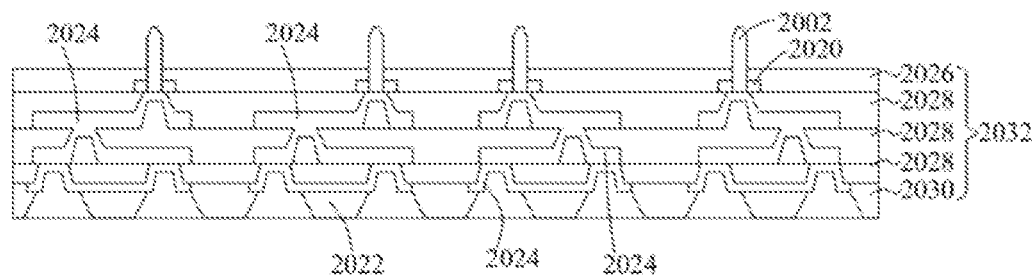
FIG. 4 is a schematic cross-sectional view showing the arrangement of the thin film substrate and the probes in the probe card device of FIG. 3.

FIG. 4 is a schematic cross-sectional view showing an arrangement of the thin film substrate and the probe in the probe card device 10' in FIG. 3. As shown in FIG. 4, the arrangement of the thin film substrate and the probes in the probe card device 10' is similar to the arrangement of the thin film substrate and the probes in the probe card device 10 in FIG. 2 except that the second surface dielectric layer 2030 is now coplanar with the adjacent second thin film connecting points 2022, and an arrangement of the rest components are same.

Figure 5:
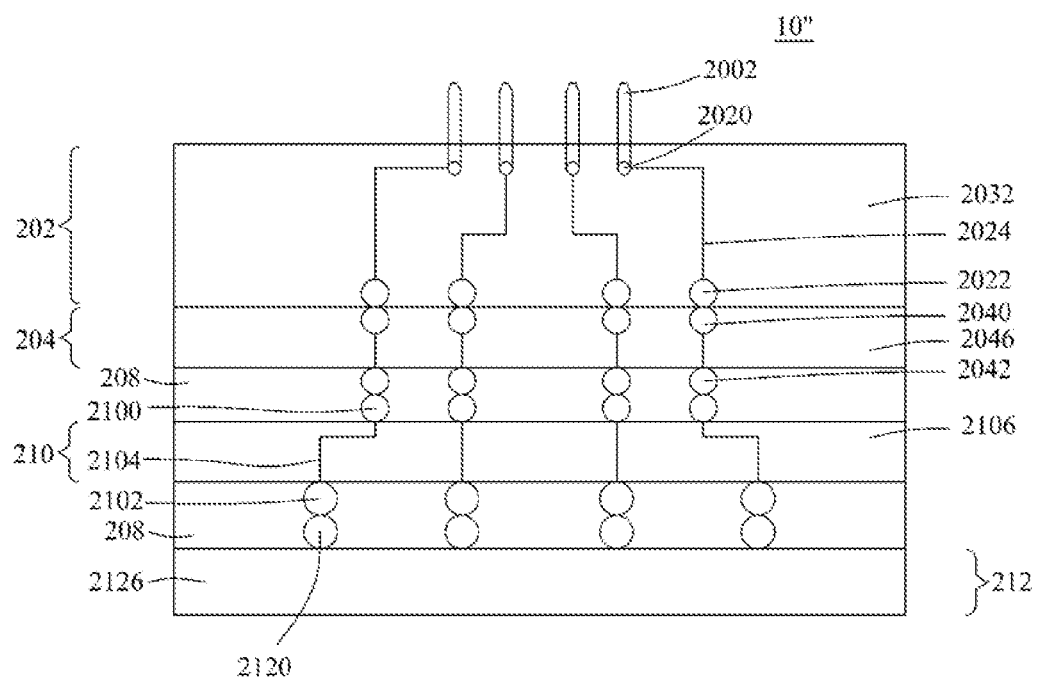
FIG. 5 is a schematic cross-sectional view showing a probe card device according to a third embodiment of the present invention.

FIG. 5 is a schematic cross-sectional view showing a probe card device 10" according to a third embodiment of the present invention. In this embodiment, the probe card device 10" is similar to the probe card device 10' shown in FIG. 3, except that it further comprises a second circuit board 210 and a third circuit board 212, and an arrangement of the remaining components of the probe card device 10" are the same as those in the probe card device 10'.

As shown in FIG. 5, the second circuit board 210 is electrically connected to the first circuit board 204, and the second circuit board 210 is electrically connected to the third circuit board 212. With the arrangement of the second circuit board 210 and the third circuit board 212, the probe card device 10" can provide more flexible wafer test functions than the probe card device 10' shown in FIG. 3. The function of the first circuit board 204 shown in FIG. 3 can be shared by the first circuit board 204, the second circuit board 210, and the third circuit board 212 shown in FIG. 5. In this embodiment, similar with the first circuit board 204 shown in FIG. 1-2, the second circuit board 210 and the third circuit board 212 respectively comprises following components:

The second circuit board 210 comprises a circuit board body 2106, a plurality of first circuit board connecting points 2100 formed over a first surface of the circuit board body 2106, a plurality of second circuit board connecting points 2102 formed over a second surface of the circuit board body 2106, and at least one internal metal layer 2104 are disposed inside the circuit board body 2106. At least one of the first circuit board connecting points 2100 is electrically connected to at least one of the second circuit board connecting points 2102 through the at least one internal metal layer 2104 of the second circuit board 210. A distance between the two adjacent first circuit board connecting points 2100 is less than a distance between the second circuit board connecting points 2102 of the second circuit board 210. The first circuit board connecting points 2100 are physically and electrically connected to the second circuit board connecting points 2042 of the first circuit board 204, respectively;

The third circuit board 212 comprises a circuit board body 2126, and a plurality of first circuit board connecting points 2120 formed over a first surface of the circuit board body 2126. The first circuit board connecting points 2120 are physically and electrically connected to the second circuit board connecting point 2102 of the second circuit board 210.

The circuit board bodies 2106 and 2126 of FIG. 5 may comprise materials such as silicon, an organic material, or a ceramic material when the circuit board bodies 2106 and 2126 are made of a ceramic material. The metal layer (not shown) of the second circuit board 210 has a line width greater than 10 microns. The via hole of the metal layer of circuit board 210 has a size greater than 20 microns. The metal layer of circuit board 212 has a line width greater than 20 microns. The via hole of the metal layer of circuit board 212 has a size greater than 40 microns. The metal layer (not shown) of circuit board 204 has a line width greater than 2 microns. Similarly, an underfill layer 208 is also formed between the first circuit board 204 and the second circuit board 210 to cover the second circuit board connecting points 2042 and the first circuit board connecting points 2100. Another underfill layer 208 is also formed between the second circuit board 210 and the third circuit board 212 to cover the first circuit board connecting points 2100 and the first circuit board connecting points 2040. Another underfill layer 208 is formed between the thin film subtract 202 and the circuit board 204 to cover the second circuit board connecting points 2102 and the first circuit board connecting points 2120.

Figure 6:
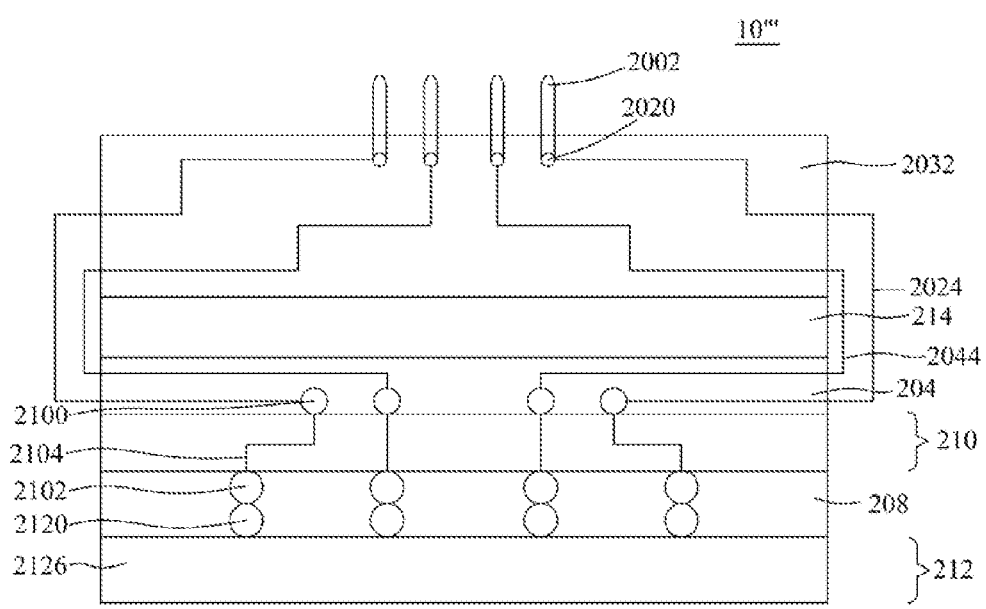
FIG. 6 is a schematic cross-sectional view showing a probe card device in accordance with a fourth embodiment of the present invention.

FIG. 6 is a schematic cross-sectional view showing the probe card device 10''' according to a fourth embodiment of the present invention. In this embodiment, the probe card device 10''' is similar to the probe card device 10'' shown in FIG. 5, except that a rigid material layer 214 is further disposed between the thin film substrate 202 and the first circuit board 204. The rigid material layer 214 is electrically insulated from the thin film substrate 202 and the first circuit board 204. In addition, an arrangement of the remaining components of the probe card device 10''' is the same as that of the probe card device 10''.

In the present embodiment, the rigid material layer 214 may include dielectric materials such as glass, ceramic, aluminum oxide ($Al_2O_3$), or the like, to further provide support for the probes 2002 in the probe card device 10'''. The inner metal layer 2024 in the thin film substrate 202 and the inner metal layer 2044 in the first circuit board 204 can be re-designed to bypass the rigid material layer 214 to form electrical connections therebetween.

Since the probe card devices 10', 10'' and 10''' shown in FIGS. 3, 5, and 6 comprise the same or similar probes 2002, the film substrate 202, and the first circuit board 204 included in the probe card device 10 of FIG. 1. Therefore, the probe card devices 10', 10'' and 10''' shown in FIGS. 3, 5, and 6 also have the same advantages and technical features of the probe card device 10 of FIG. 1, which are not described again here for clarity.

While the present disclosure has been described with the aforementioned preferred embodiments, it is preferable that the above embodiments should not be construed as limiting of the present disclosure. Anyone having ordinary skill in the art can make a variety of modifications and variations without departing from the spirit and scope of the present disclosure as defined by the following claims.

What is claimed is:

1. A probe card device, comprising:
   a thin film substrate having opposite first and second surfaces;
   a first circuit board disposed over the second surface of the thin film substrate to electrically connect to the thin film substrate; and
   a plurality of probes disposed over the first surface of the thin film substrate, wherein the probes are not deformable, and the plurality of probes and the thin film substrate are integrally formed.

2. The probe card device of claim 1, wherein there is no gap between the first circuit board and the second surface of the thin film substrate.

3. The probe card device of claim 1, further comprising a filling material layer disposed between the second surface of the thin film substrate and the first circuit board.

4. The probe card device of claim 1, further comprising a rigid material layer disposed between the thin film substrate and the first circuit board, wherein the rigid material layer is electrically insulated from the thin film substrate and the first circuit board.

5. The probe card device of claim 4, further comprising a second circuit board electrically connected to a surface of the first circuit board not electrically connected to the thin film substrate.

6. The probe card device of claim 1, wherein the thin film substrate comprises a polyimide material.

7. The probe card device of claim 1, wherein the first circuit board comprises ceramic, silicon, or glass.

8. The probe card device of claim 2, further comprising a second circuit board electrically connected to a surface of the first circuit board not directly electrically connected to the thin film substrate.

9. The probe card device of claim 8, further comprising a third circuit board electrically connected to a surface of the second circuit board not directly electrically connected to the first circuit board.

10. The probe card device of claim 9, further comprising a filling material layer disposed between the first circuit board and the second circuit board.

11. The probe card device of claim 10, further comprising a filling material disposed between the second circuit board and the third circuit board.

12. The probe card device of claim 1, wherein the thin film substrate comprises a thin film body, a plurality of thin film connecting points, and at least one inner metal layer; and
   the plurality of probes are partially embedded in the film body, wherein the probes and the thin film substrate are simultaneously formed with the plurality of thin film connecting points.

13. The probe card device of claim 1, wherein the plurality of probes are formed in the thin film substrate and protrude the first surface of the thin film substrate.

* * * * *